United States Patent [19]

Lee et al.

[11] 4,038,640
[45] July 26, 1977

[54] INTERACTIVE CONTROL SYSTEM

[75] Inventors: Barry T. Lee, Woodland Hills; Ralph V. Cole, Simi; Irving Hirsch, Beverly Hills; Gilbert P. Hyatt, Northridge; Gunther W. Wimmer, Saugus, all of Calif.

[73] Assignee: said Micro Computer Inc. by said Barry T. Lee, Ralph V. Cole, Gunther W. Wimmer

[21] Appl. No.: 354,590

[22] Filed: Apr. 24, 1973

Related U.S. Application Data

[63] Continuation of Ser. No. 101,449, Dec. 28, 1970.

[51] Int. Cl.$^2$ .................................................. G06F 9/06
[52] U.S. Cl. .................................. 364/200; 340/324 R; 340/365 R
[58] Field of Search .............. 340/172.5, 324 R, 366 R, 340/365 R; 235/151, 11

[56] References Cited

U.S. PATENT DOCUMENTS

| | | | |
|---|---|---|---|
| 3,036,773 | 5/1962 | Brown | 340/172.5 |
| 3,541,519 | 11/1970 | Thompson | 340/172.5 |
| 3,573,749 | 4/1971 | Smith et al. | 340/172.5 |
| 3,587,085 | 6/1971 | Baxter | 340/324 R |
| 3,611,347 | 10/1971 | Gingell | 340/324 R |
| 3,618,078 | 11/1971 | Wittman et al. | 340/366 X |
| 3,623,066 | 11/1972 | Norris | 340/324 R |
| 3,638,215 | 1/1972 | Payne | 340/324 R |

OTHER PUBLICATIONS

IBM 7094 Data Processing System Reference Manual, Form A22-6703, 10/21/66.

Primary Examiner—Mark E. Nosbaum
Attorney, Agent, or Firm—Gilbert P. Hyatt; Gregory L. Roth

[57] ABSTRACT

A control system for an electronic data processing system minimizes hardwiring and specialized components and circuits and provides bidirectional communication between a data processor within the data processing system and an operator via intermediary binary digital input and output words. A separate aspect is the provision of a master control panel configuration including means for receiving input and output elements having generalized identities, in conjunction with encoder and decoder means interposed in the circuitry and reducing the interconnections between the panel and the data processing system. The control system converts the status of selector switches and momentary switches to signals representing an intermediary input word. The data processor processs and interprets the signals representing the input word and generates appropriate system responses. The data processor also generates and processes intermediary output words having a selected format for controlling lamp displays and segmented elements generating numeric displays. Consequently, the panel and system have relatively few interconnections but the use of generalized terms permits input positions and output displays to have varying and selectable meanings, as determined by the data processing system itself. The interactive control system includes decoders and drivers which illuminate displays in response to the output words. Circuitry is reduced by using a single character numeric display register to control illumination of several numeric displays by sequentialy illuminating the numeric character displays at a flicker-free rate. Each numeric display is excited at a rate of 30 cycles per second, requiring the contents of the numeric display register to be changed at a cyclic rate of 240 cycles per second.

15 Claims, 7 Drawing Figures

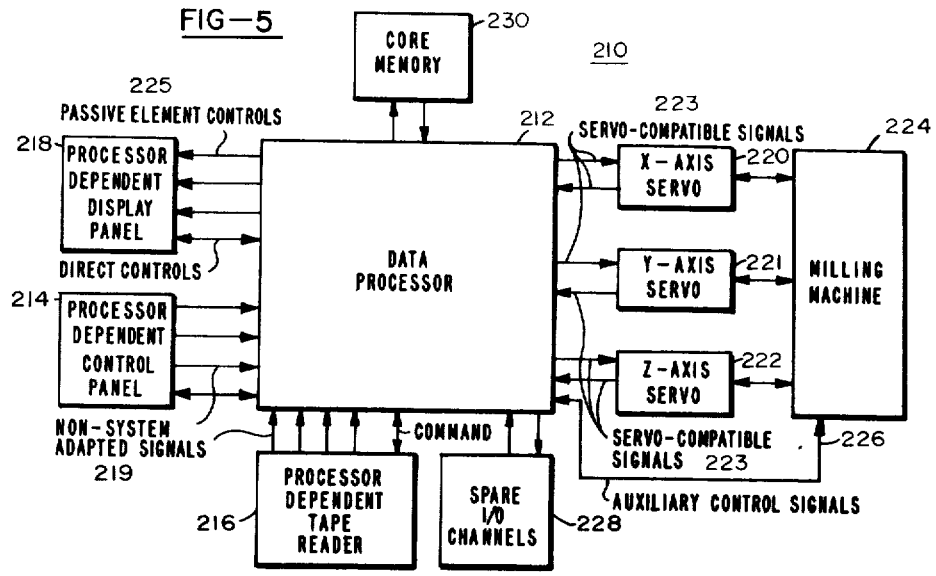
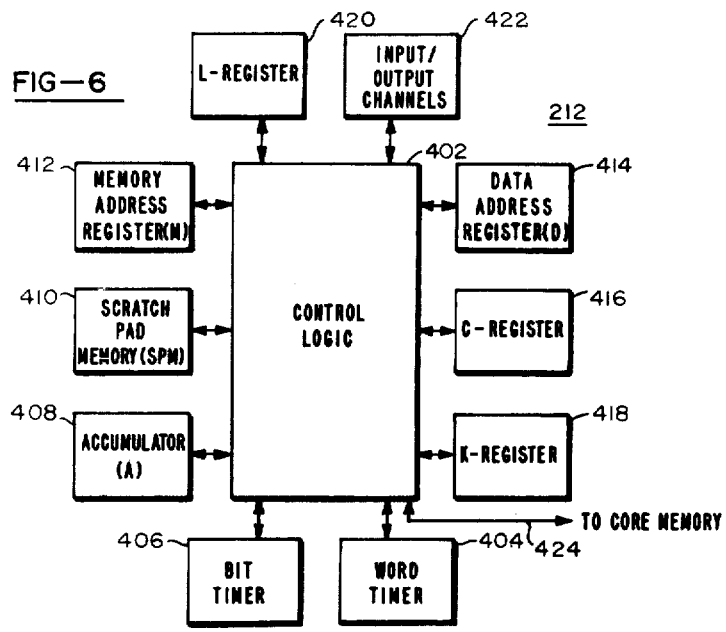

INTERACTIVE CONTROL SYSTEM

CROSS REFERENCE TO RELATED APPLICATIONS

This invention is a continuation of a copending application entitled Interactive Control System, Ser. No. 101,449, filed Dec. 28, 1970 by Barry T. Lee, Ralph V. Cole, Irving Hirsch, Gilbert P. Hyatt, and Gunther W. Wimmer and is related to a co-pending application entitled "Data Processing System", Ser. No. 101,881, filed Dec. 28, 1970 by Gilbert P. Hyatt, these applications being incorporated herein by reference as if fully set forth at length herein.

BACKGROUND OF THE INVENTION

1. Field of the Invention

This invention relates to electronic data processing systems and more particularly to control systems and panels for providing bidirectional communication between an operator and an electronic data processor.

2. History of the Prior Art

Control panels in prior art systems are typically an array of panel-mounted components, including switches and lamps, interconnected with discrete wiring and cabling, which is routed to electronics boards. Interlocking and control functions are hardwired as an integral part of the panel. The numerics are either refreshed with hardwired electronics or are not refreshed at all, but latched with redundant electronics.

Switches and lamps are often directly connected to various parts of the system to control and monitor hardwired functions.

The prior art control panels generally have large bundles of interconnecting cabling resulting in degraded reliability and poor economy coupled with hardwired functions that can only be changed by rewiring and restructuring the system physically, yield little if any degree of versatility.

SUMMARY OF THE INVENTION

Interactive control systems in accordance with the invention provide bidirectional communication between an operator and a data processing system via intermediary binary digital words. The interactive control system is an elemental extremity of the data processing system, providing unprocessed rudimentary data for a data processor and receiving preprocessed data for control of display illumination from the data processor. This elemental control system is dependent on data processor coaction for performance of the task of interactive communication with an operator. The data processor operates under the control of a selected stored program to interpret input words and produce an appropriate system response, and provide output words having an appropriate format.

A data processing system may be referred to as a "dedicated" data processing system, when committed to a particular task. A dedicated data processor is a general purpose data processor which is "dedicated" to operate only in a particular application. The dedication of the data processor denotes a limitation on the usage of the data processor having a capability to operate in additional applications.

Although a data processor that is dedicated in this sense may be a general purpose data processor of a standard commercial type, substantial peripheral and interface equipment is very often required. For example, in prior art systems completely different operator panels may be required for different applications.

Systems in accordance with the invention are characterized by a unique combination of high performance and versatility with low cost. The versatility results from extension of the general purpose programmable nature of a stored program data processor to the operator panel providing what may be termed a programmable operator panel. Consequently, the system can often be oriented or dedicated to perform a significantly different task or tasks primarily by programming changes. A concurrent low cost is attained by usage of elemental input and output units of ultimate simplicity. A mutual interdependence is employed on a systems basis between the data processor and the processor-dependent elemental panel. Of great importance, it is to be noted that this novel structuring into an elemental panel does not unduly burden or inherently restrict the data processor capability. Instead, the total system acquires a more general purpose capability.

The control switches of the control panel are not hard wired directly into the control panel lamps and other functions. Instead, the central data processor periodically samples the status of the various switches under program control, then further acts under program control to operate the various entities of the system in accordance with the status of the control switches. Because the switches are sampled under program control as opposed to being hard wired as in the prior art, the system can be used for a different dedicated application by merely changing the designations associated with the various switches and displays and changing the stored program which interprets the various switch and display conditions and causes the system to react as programmed. In addition, existing displays and switches can be easily deleted or, if desired, spare capacity permits the addition of extra displays, extra momentary switches, extra selector switches and even additional positions of existing selector switches.

Dedicated systems in accordance with the invention have particular advantage such as in the control of multi-axis machine tools and the control of photo optical plotters to provide output products. Other areas of particular advantage include the processing of communications and business data such as for payroll processing and inventory control. In all of these applications the system may receive rudimentary data from an elemental panel and process the non-adapted rudimentary signals in real time to obtain input information. The data processor in turn commands an output display in a signal form which may be readily useable by or intrinsic to the output display. Use of the processor-dependent elemental panel operating in non-adapted language modes permits great versatility to be attained with low manufacturing cost. Furthermore, orientation or dedication of the system to a different class of tasks involves no significant redesign, but primarily involves changes in the stored program of the data processor.

The data processor 12 is organized to operate in a manner somewhat similar to the data processor described in the referenced application, Data Processing System. The fundamental theory and technology of such presently known systems are described in Chapter 11 of *Digital Computer Design Fundamentals*, Yaohan Chu, McGraw-Hill Book Co., Inc. (New York, 1962).

Control panels for use in such systems are processor dependent structures having means for receiving panel elements on one side, circuit conductors on the other coupling elements to a connector, and means in the conductive paths for converting the signals to generalized terms. By this arrangement, elements can be added or changed and the significance of given panel positions can be determined at processor option. The outputs of operator controllable selector switches and momentary switches are transformed to binary codes for greater efficiency. The coded outputs from the momentary switches are gated to latches which hold the information until sampled by the data processor. Appropriate interlocks and interlock overrides may be used to control the effect of continuous depression of a momentary switch. The binary coded outputs of each selector switch form a packed intermediary input word with each binary coded output occupying a different portion of the word. The momentary switch and selector switch words are then sampled and interpreted by the data processor. Sampling and interpretation of digital words under program control by a stored program data processor is well known in the programming art, where sampling may be achieved with an input instruction and interpretation may be performed with well known table lookup routines.

A display panel is composed of both lamp displays and numeric displays. Each lamp display driver is connected to a different bit of a lamp display register such that when that bit stores a binary "1" or is "set" the lamp display is lighted. The data processor provides an output word to the lamp display register comprising packed discrete lamp control bits to cause appropriate lamp displays to be lighted. The packing of a digital word under program control is well known in the art.

The numeric display elements may be segmented tubes, Nixie tubes, or similar devices displaying a selected character. A single numeric character display register is used to control all of the numeric displays. Output words containing packed address and data are transferred to the numeric display register at a rapid periodic rate. One portion of these words contains a tube (element) select code identifying or addressing a particular element and a second part of the word contains a segment select code identifying the character to be displayed. Appropriate decoding logic, element select drivers, and character drivers are responsive to the numeric display register and causes the appropriate segment drivers of the selected numeric display tube to be activated to display the output character. Each numeric display is then driven in turn, sequentially, to display a selected character. In order to refresh the numeric display at a flicker-free rate of 30 times per second, the data processor under program control places a new word related to the next tube display in the numeric register at a cyclic rate of 30 times the number of numeric word displays desired each second. Assuming 8 numeric displays, the rate would be 240 times per second and would consume only a small part of the operating time of a modern high speed data processor. Sequentially outputting of a table of digital parameters with the associated parameter identification code is well known in the programming art.

The reduction of direct wiring connections between the interactive control system and the data processing system not only reduces manufacturing costs but provides tremendous versatility for changing system tasks to which the data processing system may be committed. Panel elements are not committed by wired connection to system circuits but are committed under program control of the data processor, providing generalized elements whose significance may be readily changed through changes in the task defining program. System controls and outputs can be varied by merely adding or deleting switches and displays by and changing associated captions in the interactive control system. Corresponding changes in data processor responses are accomplished by making appropriate changes in the stored program.

In a preferred embodiment, a stored program digital computer is provided, which is described in detail in the copending patent application, Data Processing System. The stored program computer is controlled by a program comprising computer instructions stored in a memory and accessed by instruction execution digital logic to perform computations and to generate outputs and receive inputs with output and input instructions.

Programming of digital computers is well known to those skilled in the programming art who will be able to provide programs of computer instructions for processing digital information, generating output display commands with the output instructions described herein, and receiving input switch signals with the input instructions described herein. Well known programming techniques are described in textbooks such as PROGRAMMING: AN INTRODUCTION TO COMPUTER LANGUAGES AND TECHNIQUES by Ward Douglas Maurer for Holden Day Inc. (1968); PROGRAMMING FOR DIGITAL COMPUTERS by Joachim Jeenel for McGraw Hill (1959); and ELEMENTS OF COMPUTER PROGRAMMING by Swallow and Price for Holt, Rinehart, and Winston (1965); incorporated herein by reference.

BRIEF DESCRIPTION OF THE DRAWINGS

A better understanding of the invention may be had from a consideration of the following detailed description, taken in conjunction with the accompanying drawings, in which:

FIG. 5 is a block diagram of a numerical control system in accordance with the invention.

FIG. 6 is a block diagram representation of the data processor shown in FIG. 7.

DETAILED DESCRIPTION

This invention provides an interactive control system establishing bidirectional communication between an operator and a data processing system. Control and data information passing between an operator and the system passes through an electronic data processor via the medium of intermediary binary digital words.

A preferred embodiment of the Interactive Control System of this invention will be described in detail in the following section entitled INTERACTIVE CONTROL SYSTEM. A preferred embodiment of a data processing system incorporating the Interactive Control System of this invention will be described in a subsequent section entitled SYSTEM DESCRIPTION. The data processor will be described in the following sections entitled DATA PROCESSOR DESCRIPTION and INSTRUCTION REPETOIRE, respectively. The sections describing the system, the data processor, and the instruction repetoire are brief descriptions to exemplify a preferred system arrangement for the Interactive Control System. Detailed descriptions are provided in the referenced copending patent application, Data Processing System, incorporated herein by reference. For example, the section entitled INSTRUCTION REPETOIRE describes only instructions that may provide input signals and that may generate output signals to exemplify communication between the data processor and the Interactive Control System. A detailed description of a complete instruction repetoire is provided in the referenced copending patent application.

INTERACTIVE CONTROL SYSTEM

Figure 1:
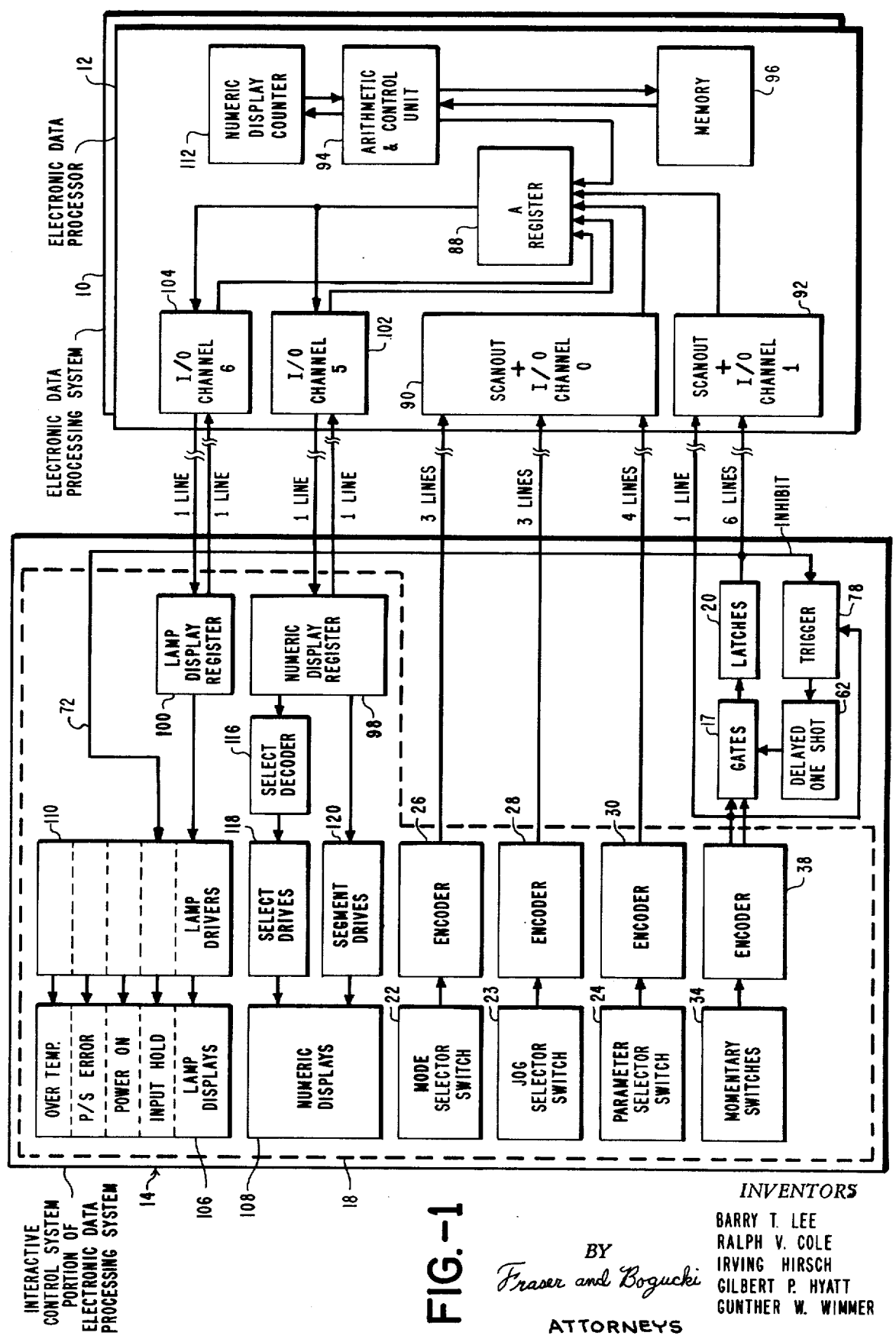
FIG. 1 is a block diagram representation of a data processing system, including an interactive control system, in accordance with the invention.

As shown in FIG. 1 an electronic data processing system 10 includes an electronic data processor 12 and an interactive control system 14. In general, the electronic data processing system may be any such system but the full advantages of this invention are best realized when used in conjunction with a system which has been committed or dedicated to a specific task or family of tasks, such as numerical control, payroll, accounting, or inventory control. It will be assumed herein, however, that the electronic data processing system 10 is committed to the task of numerical control of a milling machine. Such a dedicated system task is described in a copending application entitled "Data Processing System", Ser. No. 101,881, Filed Dec. 28, 1970, by Gilbert P. Hyatt.

Programming of stored program computers is well known in the art. A program may be documented with a written description, a flow chart, or a program listing. Because of the simplicity of the program operations for processing switch inputs and generating display outputs, descriptions will be used to exemplify program operations. Flow charts and specific machine language programs will become obvious to those skilled in the art from the program descriptions and interface descriptions herein.

The interactive control system 14 includes a control panel 16 as well as gates 18 and latches 20 which are physically located on available space of a printed circuit board within the electronic data processor 12 but functionally operate as part of the interactive control system 14.

Figure 2:
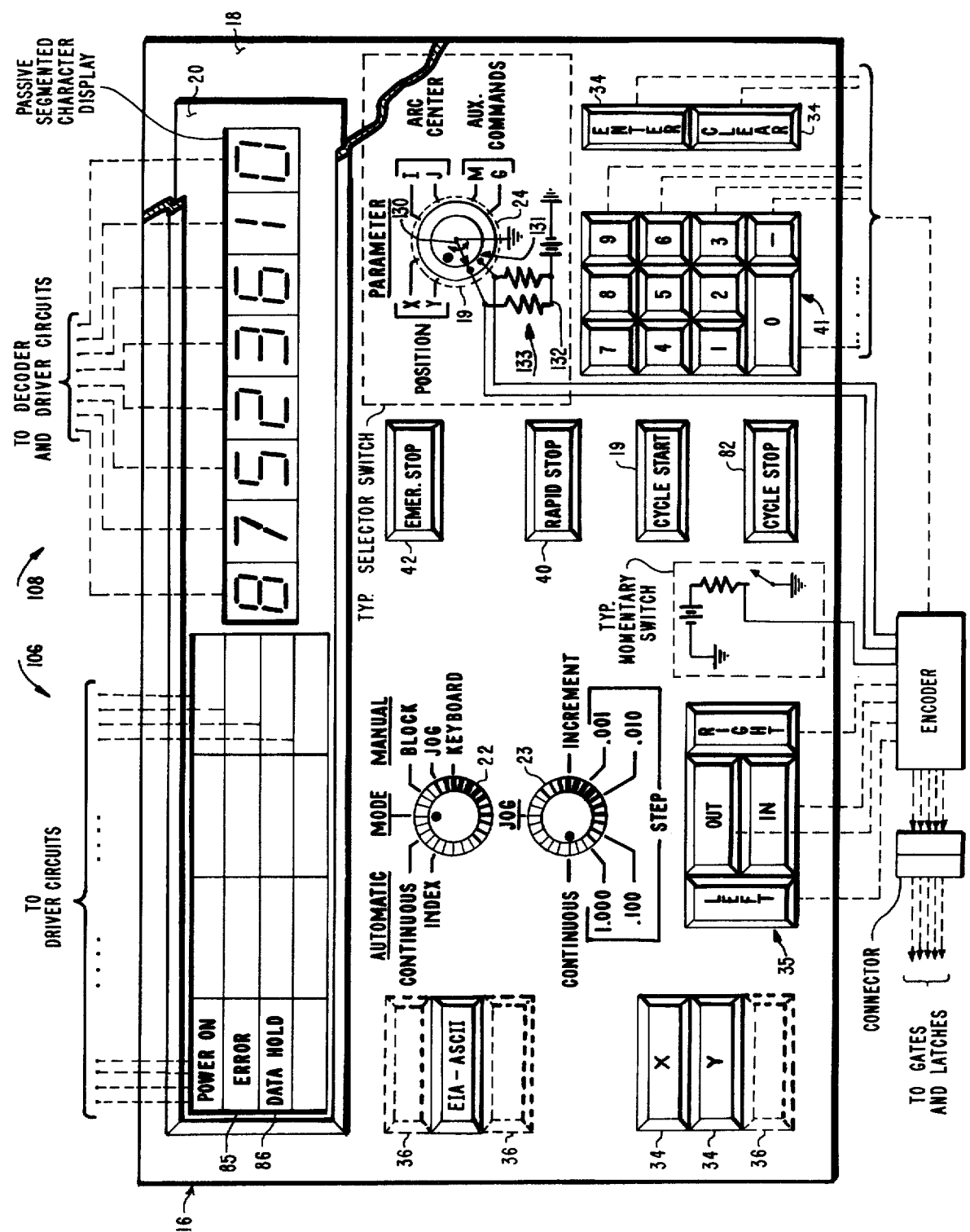
FIG. 2 is a front view, partly broken away, of a control panel board in accordance with the invention.

As shown in FIG. 2 a master panel board 18 supports components and circuits, including a display portion 20, of the control system 16. The panel board 18 may be a printed circuit board having conventional spaced apart apertures or receptacles such as 22 and 23 into which selector switches and such as 19 and 40 into which momentary switches may be inserted Printed circuit wiring to each of the element positions and some electronic circuitry is mounted on the back of the panel board 18 to facilitate error free communication with the data processor 12. By placing this circuitry in close proximity to the switches and displays, signal lines are held to a minimum length, thereby minimizing costs and errors.

Three multi-position selector switches, a mode selector switch 22, a jog selector switch 23 and a parameter selector switch 24 provide primarily control type functions. Because hardwiring of switch controls is avoided by having intermediary output words communicated to and interpreted by the data processor 12, the number of selector switches as well as the number of contacts on each selector switch can be easily varied to meet the requirements of a specific application. In this embodiment the interactive control system 14 can accommodate a maximum of 4 selector switches, each having 15 positions. However, even the 7 switch positions on the mode selector switch 22 and the jog selector switch 23 and the 15 switch positions on the parameter selector switch 24, are not fully used in this application.

The selector switches are implemented by grounding the wiper arm 130 and connecting each switch contact 131 to a positive voltage 132 through a resistor 133. This arrangement causes the signals from the contact outputs to represent the inverse of the selector switch position, a condition particularly suitable to modern integrated circuit logic gates.

As shown generally in FIG. 1 the 7 signals from the contacts of the mode selector switch 22 and the 7 signals from the contacts of the jog selector switch 23 are each converted by encoders 26 and 28 respectively, into 3-bit binary coded signals. Similarly, the 15 signals from the contacts of the parameter selector switch 24 are converted by an encoder 30 to 4-bit binary coded signals. These encoded signals are connected to Scanout and I/O Channel-O 90 which packs the parallel signals to a serial intermediary binary digital word as they are shifted into the A-Register 82 of the data processor 12.

Although each of the decoders 26, 28 and 30 can accommodate one more input signal, the binary coded output represented by all zeros is not implemented to permit the data processor to detect a switching error. If the wiper arm of a selector switch 22, 23 or 24 is between contacts or fails to make proper contact with a contact the associated encoder 26, 28 or 30 provides an all zero output. The data processor 12 interprets an all zero output as an error condition and causes an "error" display lamp 85 to be illuminated after a short delay to allow for normal switching time. The binary codes for the mode selector switch 22, the jog selector switch 23 and the parameter selector switch 24 are shown in Tables I, II and III respectively.

TABLE I

| $M_2$ | $M_1$ | $M_0$ | |
|---|---|---|---|
| 0 | 0 | 0 | Error |
| 0 | 0 | 1 | Block |
| 0 | 1 | 0 | Continuous |
| 0 | 1 | 1 | Search |
| 1 | 0 | 0 | Keyboard |
| 1 | 0 | 1 | Jog |
| 1 | 1 | 0 | Index |
| 1 | 1 | 1 | Spare |

TABLE II

| $J_2$ | $J_1$ | $J_0$ | |
|---|---|---|---|
| 0 | 0 | 0 | Error |
| 0 | 0 | 1 | Continuous |
| 0 | 1 | 0 | 1.000 inch |
| 0 | 1 | 1 | 0.100 inch |
| 1 | 0 | 0 | 0.010 inch |
| 1 | 0 | 1 | 0.001 inch |
| 1 | 1 | 0 | Increment |
| 1 | 1 | 1 | Spare |

TABLE III

| $P_3$ | $P_2$ | $P_1$ | $P_0$ | |
|---|---|---|---|---|
| 0 | 0 | 0 | 0 | Error |
| 0 | 0 | 0 | 1 | X-Position |
| 0 | 0 | 1 | 0 | Y-Position |
| 0 | 0 | 1 | 1 | Spare |
| 0 | 1 | 0 | 0 | Spare |
| 0 | 1 | 0 | 1 | I-arc center |
| 0 | 1 | 1 | 0 | J-arc center |
| 0 | 1 | 1 | 1 | Spare |
| 1 | 0 | 0 | 0 | Spare |
| 1 | 0 | 0 | 1 | M-auxiliary command |
| 1 | 0 | 1 | 0 | G-auxiliary command |
| 1 | 0 | 1 | 1 | Spare |
| 1 | 1 | 0 | 0 | Spare |
| 1 | 1 | 0 | 1 | Spare |
| 1 | 1 | 1 | 0 | Spare |
| 1 | 1 | 1 | 1 | Spare |

Referring now to FIG. 2, 24 momentary switches typified by switches 34 are shown mounted on the back panel board 18. As with the selector switches, the number of momentary switches can be easily varied to meet the requirements of a specific application. The circuitry of the present embodiment can accommodate up to 31 momentary switches with locations for possible additional switches represented by dotted outlines 36.

Reed switches which are mounted in apertures in the panel board 18 are used exclusively in the preferred embodiment for the momentary switches to insure the highest level of reliability, versatility and cost effectiveness, but other well known switches may also be used. As with the selector switches, the momentary switches are implemented by grounding the wiper contacts and connecting the stationary contacts through a pull down resistor to a positive voltage.

Figure 3:
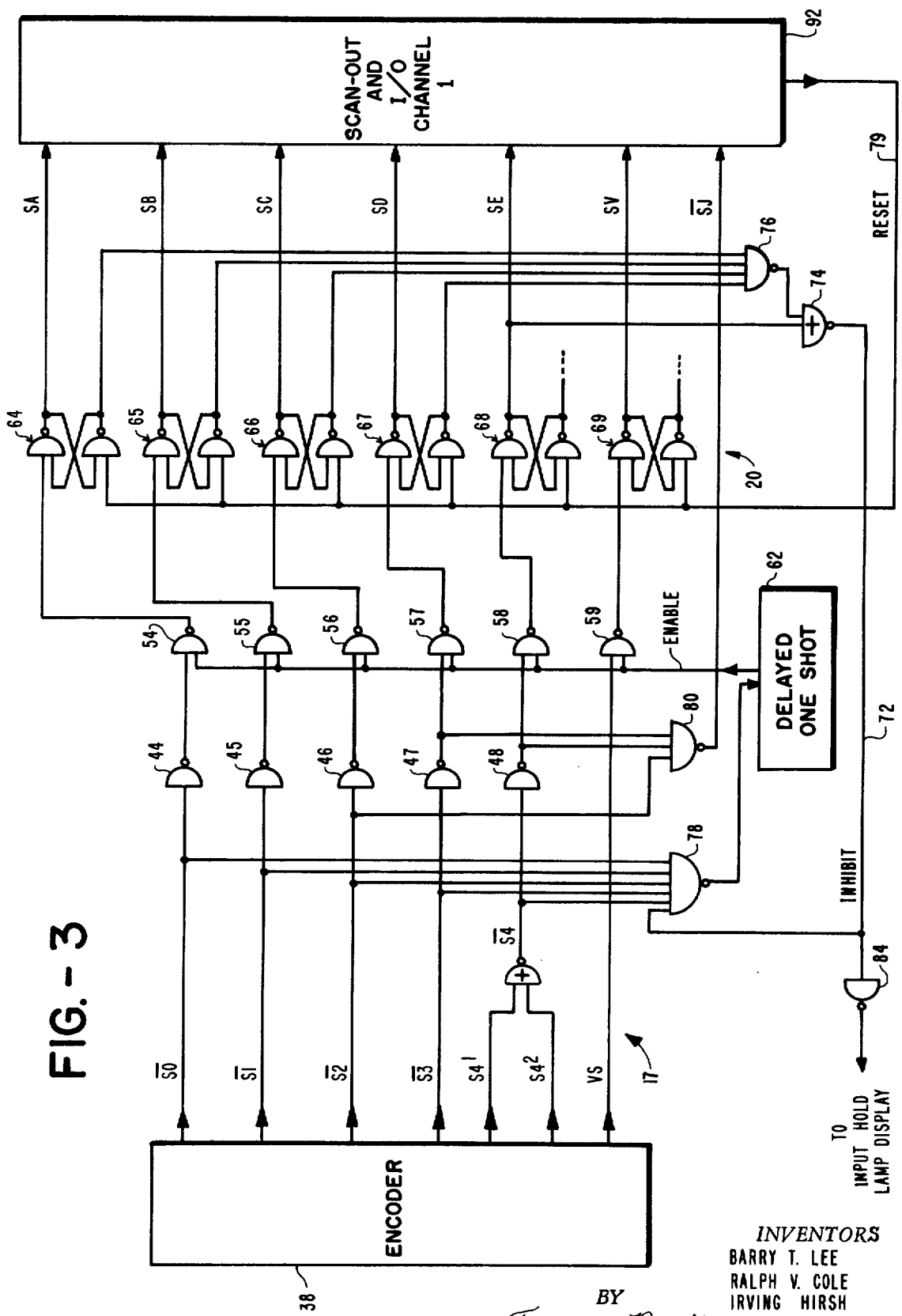
FIG. 3 is a block and gating diagram representation of an encoder and latching arrangement that may be employed in the system of FIG. 1.

As shown in FIGS. 1 and 3, the 31 unitary outputs are converted by an encoder 38 to a 5-bit binary coded signal, thereby reducing the number of transfer lines to minimize interconnections and circuitry. The five binary signals are $\overline{S}_0$ through $\overline{S}_4$ with two partial signals, $S_4'$ and $S_4^2$ being NORed together to form the total $\overline{S}_4$ signal. In addition, a sixth signal Vs performs a verify function by indicating depression of either a rapid stop switch 40 or an emergency stop switch 42 (FIG. 2). The signals $\overline{S}_0$ through $\overline{S}_4$ are connected through inverting logic gates 44-48 to logic gates 54-58 respectively. The signal Vs is connected directly to logic gate 59. The logic gates 54-59 pass the signals $S_0 - S_4$ and Vs on to latches 64-69 respectively only when an enable signal is received from a delayed one shot 62.

The latches 64-69 permit the data processor 12 to sample to intermediary binary digital output word represented by the latch outputs at a rate of 10 times each second. Periodic sampling of external signals is well known in the programming art such as with real time program operations. This rate is sufficiently high to avoid inconvenience to an operator who may not depress a subsequent momentary switch until the output from a previously depressed momentary switch has been sampled by the data processor 12 which resets the latches 64-69 with reset signal 79 upon completion of the sampling operation.

A system of lockouts and lockout overrides is used to minimize errors while still permitting the interactive control system 14 to accomplish all necessary functions. An inhibit signal 72 is produced by logic gates 74 and 76 which are connected to latches 64-68 and produce an inhibit signal 72 whenever any of the latches 64-68 are set. The latch 69 which latches the Vs stop verify operates independent of the inhibit signal. The inhibit signal 72 is connected to a NAND gate 78 which provides a trigger signal to the delayed one shot 62 as an output. The gate 78 is also connected to binary signals $\overline{S}_0 - \overline{S}_4$ and produces a trigger signal only when a signal is produced on at least one of the binary outputs $\overline{S}_0 - \overline{S}_4$ subsequent to a condition in which there is no inhibit signal and no signal on any of the binary outputs $\overline{S}_0 - \overline{S}_4$. In other words, the output of a subsequent momentary switch cannot be gated and latched until the latches 64-68 have been reset with reset signal 79 and all previously depressed momentary switches have been released.

The delayed one shot 62 produces a 3 microsecond pulse following a 10 millisecond. The 10 millisecond permits transient switching conditions such as switch bounce inherent in all momentary switches to subside before the binary outputs $S_0 - S_4$ and Vs are gated to the latches. Thus, the lockout arrangement not only prevents errors created by the depression of more than one momentary switch but also prevents errors due to transient switching conditions.

A special signal is provided by NAND gate 80 which produces a signal on output $S_j$ whenever the condition $S_4 \cdot S_3 \cdot \overline{S}_2$ exists. The signal $S_j$ forms a part of the intermediary binary digital output word but bypasses the gates 54-59 and latches 64-69. The signal $S_j$ indicates depression of one of the jog direction switches 35, left, right, in or out. This permits the data processor to identify if a jog direction switch is maintained in the depressed state for the jog continuous condition.

The inhibit signal 72 is inverted by a NAND gate 84 to provide a data hold signal. This data hold signal controls a data hold or input hold lamp display 86 (FIG. 2) which becomes illuminated to indicate a set condition of one of the latches 64-68. As long as the input hold lamp display is illuminated the operator knows he should not depress another momentary switch. The binary codes for the momentary switches are presented in Table IV.

TABLE IV

| $V_s$ | $S_4$ | $S_3$ | $S_2$ | $S_1$ | $S_0$ | |
|---|---|---|---|---|---|---|
| 0 | 0 | 0 | 0 | 0 | 0 | Spare-0 |
| 0 | 0 | 0 | 0 | 0 | 1 | Keyboard 0 |
| 0 | 0 | 0 | 0 | 1 | 0 | Keyboard 1 |
| 0 | 0 | 0 | 0 | 1 | 1 | Keyboard 2 |
| 0 | 0 | 0 | 1 | 0 | 0 | Keyboard 3 |
| 0 | 0 | 0 | 1 | 0 | 1 | Keyboard 4 |
| 0 | 0 | 0 | 1 | 1 | 0 | Keyboard 5 |
| 0 | 0 | 0 | 1 | 1 | 1 | Keyboard 6 |
| 0 | 0 | 1 | 0 | 0 | 0 | Keyboard 7 |
| 0 | 0 | 1 | 0 | 0 | 1 | Keyboard 8 |
| 0 | 0 | 1 | 0 | 1 | 0 | Keyboard 9 |
| 0 | 0 | 1 | 0 | 1 | 1 | Keyboard Clear |
| 0 | 0 | 1 | 1 | 0 | 0 | Keyboard Enter |
| 0 | 0 | 1 | 1 | 0 | 1 | Spare-13 |
| 0 | 0 | 1 | 1 | 1 | 0 | Spare-14 |
| 0 | 0 | 1 | 1 | 1 | 1 | X |
| 0 | 1 | 0 | 0 | 0 | 0 | Y |
| 0 | 1 | 0 | 0 | 0 | 1 | Spare-17 |
| 0 | 1 | 0 | 0 | 1 | 0 | Spare-18 |
| 0 | 1 | 0 | 0 | 1 | 1 | Cycle Start |
| 0 | 1 | 0 | 1 | 0 | 0 | Cycle Stop |
| 1 | 1 | 0 | 1 | 0 | 1 | Rapid Stop |
| 1 | 1 | 0 | 1 | 1 | 0 | Emergency Stop |
| 0 | 1 | 0 | 1 | 1 | 1 | Spare-23 |
| 0 | 1 | 1 | 0 | 0 | 0 | In |
| 0 | 1 | 1 | 0 | 0 | 1 | Out |
| 0 | 1 | 1 | 0 | 1 | 0 | Left |
| 0 | 1 | 1 | 0 | 1 | 1 | Right |
| 0 | 1 | 1 | 1 | 0 | 0 | Spare-28 |
| 0 | 1 | 1 | 1 | 0 | 1 | Spare-29 |
| 0 | 1 | 1 | 1 | 1 | 0 | Spare-30 |
| 0 | 1 | 1 | 1 | 1 | 1 | Spare-31 |

The momentary switches include the keyboard switches 41, Cycle Start switch 19, Jog Direction switches 35 and Clear switch 34. All of the momentary switches are hermetically sealed reed switches. A latching interlock is provided, making the system insensitive to dynamic switch conditions such as switch bounce. In addition, operation is independent of operator action such as the duration of switch depression and additional switch commands which might result in ambiguities are automatically locked out as long as one of the momentary switches remains depressed.

For operator convenience the momentary switches are grouped into functional arrays, for example, the Keyboard switches 41 and the Jog Direction switches 35.

The Cycle Start switch 19 and the Cycle Stop switch 82 are used to initiate or terminate automatic operation, respectively.

The keyboard 41 is composed of ten numeric keys defined as 0 through 9 and a negative sign key. The zero key can be used for the plus sign when required. The numeric and sign keys of the keyboard are used to enter data in the Keyboard mode and a Clear key 34 adjacent to the keyboard 41 blanks the numeric displays prior to the entering of the data. An Enter key 34 causes a parameter to be accepted by the numeric control system after it has been entered through the keyboard and verified by the operator's observation of the numeric display. In the Keyboard mode the various parameters can be varied or entered as required. Parameter verification is achieved by rotating the parameter selector switch 24 to the respective position and monitoring the numeric display. Parameter modification is accomplished by depressing the Clear key 34, resulting in the blanking of the numeric display, and the sequential depression of the sign and numeric keys of the keyboard, resulting in a presentation on the numeric display of the newly keyed numbers. The entered parameter will automatically be transferred to the computer.

The Jog Direction switches 35 are used by the operator to define the direction of motion and to initiate this motion, but only if the system is in the Jog mode. In addition, the position of the Jog selector switch 23 will define the type of motion, i.e., Continuous, Step, or Increment. The jog directions of (1) Right, (2) Left, (3) In, and (4) Out, are defined by facing the machine from the control panel side.

The rapid stop switch 40 causes all machine motion to stop immediately, but permits operation to be resumed with the Cycle Start switch 19.

A pair of Mirror Image switches 34 are used to selectively reverse the commanded directions of motion. Alternate depression of the X or Y mirror image switches 34 will cause the mirror image lamp displays 38 to change state from +X or +Y to −X or −Y and conversely. The operational condition presented on the mirror image status indicator lamps defines to the operator system conditions.

Referring now to FIG. 1, the binary coded outputs from the three selector switches 22, 23, 24 are packed or combined to form a single intermediary binary digital input word which is shifted into the A-Register 88 of the data processor 12 through Scanout and I/O Channel-0 90 under control of an input instruction. Similarly, the outputs from the momentary switches are used to form an intermediary binary digital output word which is shifted into the A-Register 88 through Scanout and I/O Channel-1 92 under control of an input instruction. Input instructions will be discussed in detail hereafter.

Well known input programming operations will now be discussed. Input program routines may load a digital word and process or manipulate the loaded word. Loading may be accomplished with an input-output instruction as will be discussed hereafter which may load the input word into a computer register such as A-Register 88. Processing may include well known unpacking operations where the input word may be unpacked to isolate the desired portion and may include performing operations on the processed input word. Operations on a processed input word may include storing the input word in memory for later use or may include well known table look-up program operations to interpret the input information. Table look-up operations provide flexibility in configuring a program because a program table can be easily changed to provide different interpretations of digital information as is well known in the programming art.

Once an intermediary input word is within the A-Register 88 it is manipulated and interpreted by an arithmetic and control unit 94 operating under control of program instructions stored in a memory 96. After an input word has been interpreted, the data processor 12 generates appropriate system responses.

Registers in a stored program data processor may be time shared between a plurality of different instructions as is well known in the computer art. These registers store parameters that are related to the particular computations as these computations are being performed and, therefore, may change at a high data rate which may be as high as the instruction execution rate of the data processor or greater. The memory address register is updated at a rate greater than the instruction rate. The accumulator register may be updated at a rate equal to or less than the instruction execution rate. These registers will be discussed in detail hereafter.

As is well known in the art, an operator display requires display information to be stored for a duration of time related to an operator's visual characteristics, which may be millions of times slower than the instruction execution rate of a modern high speed data processor. Therefore, in one embodiment of the present invention; interface registers are provided for storing intermediate display words from the data processor, thereby permitting the registers in the data processor to continue with the computational task which requires the availability of the data processor registers. In particular, the data processor register may be the A-Register 88 and the display register may be the Lamp Display Register 100 or the Numeric Display Register 98 or both as shown in FIG. 1. The data processor registers and the interface display registers will be described in more detail hereafter.

The data processor 12 also generates preprocessed intermediary output words having selected formats and transfers them from the A-Register 88 to a numeric display register 98 and a lamp display register 100 through I/O Channel-5 102 and I/O Channel-6 104, respectively. These channels provide bidirectional communication of intermediary output words with the A-Register, permitting previously output words to be returned to the A-Register 88 to check for errors occurring during transmission. The interpretation and processing of intermediary words takes place within the data processor 12. The lamp display register and the numeric display register may each be well known registers, but in a preferred embodiment are registers such as the C-Register shown in FIG. 7.

The displays include both lamp displays 106 and numeric displays 108. As shown in FIG. 2 both the lamp displays 106 and the numeric displays 108 are mounted on the display subpanel board 20 which is in turn mounted on the mother panel board 18. The lamp displays 106 may be conventional bayonet type lamps and the display subpanel board 20 contains a batch fabricated block of lamp sockets which receive the lamps 106. These lamp sockets provide the multiple functions of mounting, electrical connection and heat sink. Each lamp may be selectively connected to ground either directly or through a flasher bus. The lamp displays 106 are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays.

The numeric display elements 108 are conventional 9 segment displays capable of displaying all numerical characters and some alphabetic characters. However, the interactive control system 14 has sufficient data capacity to accommodate 13 segment tubes capable of displaying all numeric and alphabetic characters if desired. The eight numeric display elements 108 of this embodiment are mounted horizontally on the display subpanel board 20.

Coupled to the lamp displays 106 are lamp drivers 110 which are controlled from the lamp display register 10C. With the exception of a few lamp drivers 110 which are hardwired to respond to special functions such as over temperature, P/S error, Power on and input hold, each lamp driver 110 responds to a selected bit of an intermediary binary digital output word stored in the lamp display register 100. The data processor 12 may be programmed to pack the lamp condition bits together in a lamp control word, then to output the lamp control word to the lamp display register 100 with well known programming operations.

Figure 4:
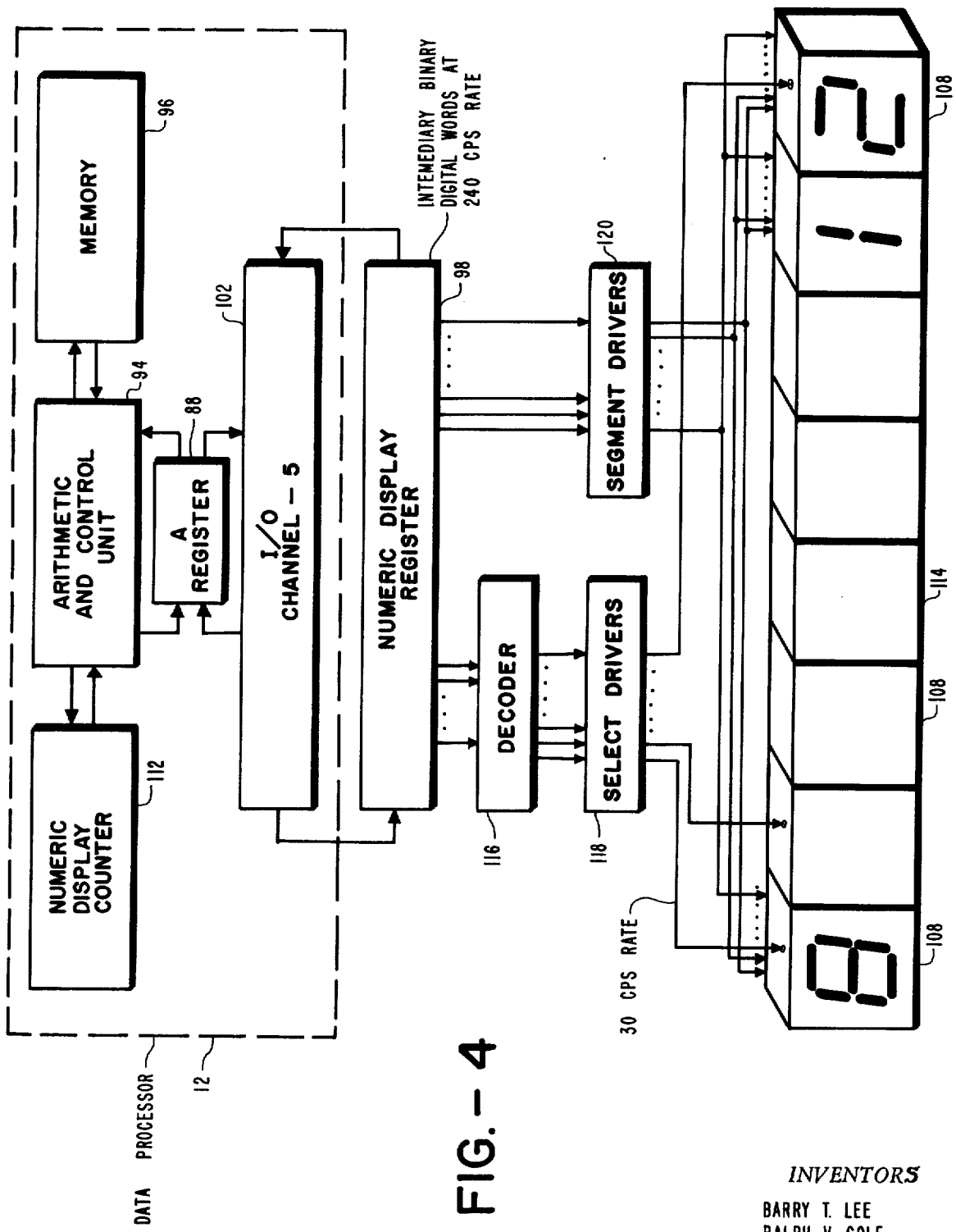
FIG. 4 is a block diagram representation of the data processing system of FIG. 1 showing further details of the relationship between displays and the processor.

As shown in greater detail in FIG. 4, the implementation of the 8 numeric display elements 108 is considerably more complex than that used for the lamp displays 106. Because each numeric display element 108 requires multibit control signals a cyclic technique is used to drive all eight numeric displays elements 108 from a single element numeric display register 98, thereby greatly reducing the amount of circuitry required. To accomplish this the eight numeric display elements are sequentially excited at a flicker-free 30 cps rate. In order to excite each numeric display element 108 at a rate of 30 cps the contents of the numeric display register must change at a cyclic rate of 240 cps. Well known output programming operations will now be discussed. Output program routines may process a digital word and output the processed word. Processing may be performed with well known table look-up routines to obtain the desired information, and may include arranging the information in a format desired by the external equipment. Arrangement of the information may include well known conversion routines for converting to a desired code and well known packing routines for packing together of different parts of a desired output word. A word that has been prepared for outputting may be output to an external device such as with an output instruction described in detail hereafter.

The numeric display functions are performed in the data processor 12 under program control and include the numeric display counter 112, the update control, the refresh control, and the data registers. These functions are not physically identifiable, but are implemented under program control of the data processor. The display parameter is converted from a binary to a BCD code, then modified for the special segment code requirements of the numeric display tube. Conversions such as from binary code to BCD code or from BCD code to special codes as discussed above are well known in the programming art. The tube identification code is packed into the word, which is output to the numeric display register in the interactive control system. Packing of digital information together in a digital word is also well known in the programming art. Operation of one embodiment of a stored program data processor and an associated output instruction is discussed hereafter.

In order to excite one of the numeric display elements 108 the data processor 12 utilizes the count of the numeric display counter 112 implemented under program control, for example, binary 3 indicating that the fourth numeric display element 114 is to be excited, to access a location in the memory 96 storing information to excite the fourth numeric display with the proper character. It should be noted that the binary numbers 0 through 7 represent the first through the eighth numeric display elements, with binary number three representing the fourth numeric display element. This information is transferred from the memory 96 to at least significant portion of the A-Register 88 where it is joined by the binary count from the numeric display counter parameter (3) stored in memory. In the most significant portion to form the intermediary digital output word. Table lookup operations are well known in the programming art, where the address of the output parameter may be used as an index for accessing a table of output parameters in memory. Packing together of portions of a word is also well known in the programming art, where both the parameter and the address of the parameter may be packed together.

This output word is transferred from the A-Register 88 through I/O Channel-5 102 to the numeric display register 98. After the word is output the numeric display counter is incremented by the data processor under program control so that the fifth numeric display element will be excited next. In addition to providing intermediary output words to the numeric display register at a rate of 240 cps, the data processor also updates the locations in the memory 96 which store the information determining the numeric character to be displayed by each numeric display element. This updating occcurs at a cyclic rate of 16 cps or twice per second for each memory location. This is about as fast as the eye of the operator can follow changes in the characters displayed by the numeric display elements 108. The preceding description of program operations may also be provided in flow diagram form, as will be obvious to those skilled in the programming art.

The contents of the three numeric display select bits in the most significant portion of the numeric display register 98 are communicated by three pairs of lines, each pair representing the Q and $\overline{Q}$ outputs from a flip-flop, to a decoder 116. The decoder 116 activates one of eight select drivers 118, the fourth select driver in this instance. Simultaneously, nine segment drivers 120 are selectively excited according to the character information stored in the least significant portion of the word in the numeric display register 98, each driver being responsive to a different bit. In some circumstances, it may be desirable to convert the character information to a binary code, thereby reducing the number of bits required to define a character, but necessitating the use of a decoder between the numeric display register 98 and the segment drivers 120. However, such a coded technique is not used in this application.

The segment drivers 120 present drive signals forming the stored character to the appropriate segments of all eight numeric display elements 108. However, only the fourth numeric display element 114, which receives a select signal from the select drivers 118, displays the selected character.

The elemental nature of system subsystems, and the related data processor coaction under program control may be utilized to simplify system setup procedures, thereby minimizing setup time as well as errors. One of the major problems that every user of sophisticated control equipment has is that of familiarizing a new operator with the complex maze of switches, lights and other controls. This is particularly important to a company which has a high turnover of personnel. Even experienced operators, on occasion will neglect to set a switch properly or overlook a procedure which could have a disastrous result.

The interactive control system 14 of this invention provides a means for interactivity between the data processor 12 and an operator. Included in this interactivity is a unique feature which permits the data processor to "lead the operator by the hand" through various operations and procedures the operator must perform for proper machine operations.

For this purpose, an operator's manual may be used in conjunction with the numeric displays 108 on the control panel and a special program in the data processor 12. The operator's manual is divided into several sections, each pertaining to a particular mode of machine operation. The parameter switch 24 would be set to a specified position defining an interactive system initialization condition. This condition would cause the data processor to sense system conditions and respond under selected program control by causing the numeric displays to display a code number identifying a section in the operator's manual. The operator would look up the number in the operator's manual to identify the machine condition or status and the next step of the procedure to place the system into its desired mode. As each procedural step is taken, a new code number appears, showing whether the last step was properly performed until the system can be started. This permits a totally inexperienced operator to sequentially perform the entire system set up or initialization.

SYSTEM DESCRIPTION

In a typical example of the operation of the system of FIG. 5 for control of a milling machine 224, the data processor 212 accepts part program data from the tape reader 216 and operator inputs from the control panel 214 to commence the computation of servo commands. As the reader 216 and panel 214 are operated, the processor 212 is under program control to monitor the operative states and pre-process data. Concurrently, and also under program control, the display panel 218 is activated by exciting the passive elements to form desired characters at a flicker-free rate. These monitoring and pre-processing subtask functions concerned with the extremities 214, 216, 218, 220, 222 continue to be carried out as the processor 212 performs computational and processing functions concerned with its main task, that of executing the part program. Thereafter, command data is translated into servo commands for the individual servos 220, 221, and 222, in servo signal form. Feedback signals in the servo format are likewise returned to the processor 212, pre-processed for conversion into the processor base language and utilized in further computations.

As shown in FIG. 5, the data processor 212 receives data from the various input sources, performs calculations or otherwise manipulates data in accordance with the input information and outputs processed information to control the machine 224 through servos 220, 221, and 222 and auxiliary control signals 256.

The present invention more particularly incorporates computer functions of controlling, performing mathematical operations, and storing data into a physically distributed, operatively dispersed system providing control of coaction with extremities.

The milling machine 224 is an extremity of the system which can be implemented as an elemental extremity in conjunction with the data processor 212. Direct control of the various machine functions, such as storing the tool positions, compensating for tool characteristics, and controlling a turret motor for tool selection, reduce the machine interface that is often implemented with relay logic and other such "magnetics". The machine axes pickoffs in the square-wave servo loop can be used directly by the data processor to derive position, velocity and acceleration information pertaining to the motion of machine axes.

The axes servos 220-222 are a typical example of extremities. The communication between the data processor and the axes servos is in a signal form wherein the whole number aspect is intrinsic to the data processor and wherein the square-wave aspect is intrinsic to the axes servos. This intrinsic signal form simplifies the communication interface between the data processor and the axes servos and relieves limitations previously imposed on servos for numerically controlled machines.

The operative dispersion associated with this factored computer system is typified by the multi-axes contouring capability of the system. The data processor performs the contouring computations in whole number form intrinsic to the data processor and generates the resultant whole number commands for the axes servos, providing high performance with a significant reduction in hardware and a reduction in the computational burden placed on the data processor. The signal forms of the servos have a whole number square wave characteristic that is acceptable to the data processor in a non-adapted form to provide interactive communication between the data processor and the axes servos to provide adaptive control capability with this elemental extremity. The axes servos illustrate an extremity that can yield economy and versatility with a reduced burden on the data processor together with the additional capability of adaptive control.

This system comprises a numerical control machine, e.g., for three axis controlled machine, and closely integrates the operator and other input and output functions into the numerical control tasks. Minimal structure input-output extremities in this particular example comprise an elemental tape reader 216, operator control panel 214, servos 220-222 for independent tool axis control and a passive data display 218. The data processor 212 concurrently monitors these extremities, pre-processes data and generates extremity commands. The computer operates under program control to perform the other aspects of the task, including carrying out computations for tool path control, generating servo commands for each of the controlled axes, sequencing through the program, providing other machine controls and generating graphical and printed output data if needed.

Part program inputs are provided by a photoelectric punched tape reader 216 having Model No. RRS0304RA, manufactured by Remex Electronics.

Data and program storage is provided by a core memory 230 which may be a commercially available memory having Part no. 909838-A01, manufactured by Electronic Memories, Inc. This is an 8 bit 4096 word core memory which is primarily devoted to program storage. Remaining portions may be used for data storage if desired. In this application, the core memory 230 (CM) may be replaced by a read-only memory (ROM) or flip-flop-memory.

Generally, the system operates by having the data processor sample the output of the tape reader 216 at a cyclic rate which is much faster than the operation of the tape reader 216. Formatting of tape is in accordance with EIA standards RS-274-B, INTERCHANGEABLE PERFORATED TAPE VARIABLE BLOCK FORMAT FOR CONTOURING AND CONTOURING/POSITIONING NUMERICALLY CONTROLLED MACHINES.

For the performance of many tasks, as in the numerical control field, systems in accordance with this invention can utilize a relatively small-scale computer without overloading. Concurrent performance of the subtasks does not in the usual instance result in excessive demands on the processor. To the contrary for numerical control systems, the general purpose computational capability of the system hereafter described can generally be utilized to perform many functions such as contouring functions.

The units 214, 216, 218, 220, 221, and 222 are extremities of the processor 212. These extremities, which may not be independent in terms of control, are largely directly coupled to the processor 212. Each extremity relies essentially upon the program capabilities of the processor 212. Each further effectively relies upon the processor 212 for pre-processing of the non-adapted signal forms for interpretation of signals and data transfer. In this respect, buffering, conversion, and signal conditioning functions ordinarily provided by interface circuits are also avoided. In a further respect, system extremities present data or output data in signal forms such that the processor itself can effect the significance of such terms.

This task-performing system may readily be modified, with a minimum of hardware changes to perform another task. Such change entails the essential modification of the system program, and also modification of the subtask programs and their relation to the task-pertinent program.

DATA PROCESSOR DESCRIPTION

A general purpose data processor is provided which is fully implementable with integrated circuits. Thus, an integrated circuit read-only memory (ROM) provides an example of a capability not found in present data processing systems. Other examples are a random access memory (RAM) and other types of flip-flop memories used alone or in combinations of integrated circuit memories for this data processing system.

The data processor 212 is shown by way of this example to be used in conjunction with a core memory 230. The basic architecture of this data processor will permit an integrated circuit memory, such as a read-only memory (ROM), or a random-access memory (RAM) or flip-flop type memory to be substituted for the core memory 230 to provide a completely integrated circuit computer which might be called a monolithic computer.

A general purpose data processor in accordance with this invention may include multiple data and program registers, a random access memory and a scratch pad memory, and non-buffered, directly coupled input-output lines connected to elemental input-output devices.

The data processor 212 is organized to process 8 bit words with most working and storage registers having a 16 bit capacity permitting the storage of two words. Serial transfer of data is used throughout the data processor 212 to minimize the control logic required.

The data processor 212 includes a 12 bit memory address register (M-Register) which defines a memory location being accessed in the core memory. A memory data register (D-Register) provides communication with the memory and an accumulator Register (A-Register) receives the results of numerical and logical operations and communicates with several Input/Output (I/O) channels. Thirty two Scratch Pad Memory (SPM) Registers provide convenient intermediate storage, independent of the main memory. A three bit counter divides the execution of program instructions into word times and a four bit counter subdivides the word times into bit times, the basic operating intervals.

The data processor operates by executing programmed instructions received from the core memory or other storage. When an instruction is executed, control logic causes the data processor to progress through a matrix of microoperations, the exact path varying with the instruction being executed. Each micro-operation occurs during one of eight possible word times and performs a micro-operation portion of the instruction being executed. Upon completion of an FZ micro-operation, the data processor recycles through the matrix to begin execution of the next instruction.

The architecture of the data processor 212 lends itself to a fully integrated circuit computer mainframe where all of the logic is implemented with integrated circuits in a conventional manner and additionally includes an integrated circuit scratch pad memory (SPM). Further, this data processor 212 has the architecture to use an integrated circuit read-only memory (ROM) in place of or in addition to the core memory 230 providing a data processor that is constructed wholly of integrated circuit components.

In a simplified block diagram, the data processor 212 is shown in FIG. 6 as control logic 402 interconnecting registers, timers and communication channels.

The basic timing operations of the data processor 212 are performed by a word timer 404 and a bit timer 406. The synchronization of the data processor 212 is provided by an 8 MHz clock signal which is included as part of the control logic 402. A synchronizing clock signal is an asymmetric square wave, the positive portion of which is designated $P_3$ and the negative portion of which is designated $\bar{P}_3$. An asymmetrical character of the clock signal permits a longer clock period without sacrifice of processing speed. The word timer 404 is a three-bit counter with associated decode logic. It counts from 0 to 7 as the data processor cycles through the micro-operations during the performance of an instruction with each micro-operation being performed in a different word time. The associated decode logic provides eight output lines, each being true during one of the eight different counting states of the word timer 404. These output signals are used by the control logic 402 for sequencing the data processor through the micro-operations associated with an instruction. The bit timer is a four-bit binary counter with associated decode logic. The bit timer 406 counts down from 15 thru 0 and consequently the associated decode logic has 16 output lines, each going true during a different one of the 16 possible counts of the bit timer 406. The bit timer 406 provides sequencing and timing within a given micro operation or word time.

An accumulator (A-Register) 408 is the basic arithmetic register and is used as the repository of the results of arithmetic and logical operations. It is also the source and destination of the Input/Output (I/O) parameters. The A-Register is a 16 bit serial in, serial out shift register. Associated with the A-Register 408 is a serial full adder which is included within the control logic 402.

A scratch pad memory (SPM) 410 provides storage for intermediate computational results, return addresses, indexes and other pertinent information. The SPM 410 provides rapid internal storage without the need for transferring data to the main memory. It is a group of 32 16 bit serial in, serial out registers which are divided into two pages with 16 registers on each page. Paging is accomplished by toggling a flip-flop which automatically selects page 0 when the power is turned on.

A memory address register (M-Register) 412 holds the 12 bit address of an eight-bit byte to be accessed from the program memory. The M-Register 412 is a 12-bit shift register having the capacity to address up to 4,096 different memory locations. It has a serial input and both serial and parallel outputs. Associated with the M-Register 412 but represented as being within the control logic 402 is a serial full adder which increments the M-Register to access sequential instructions or, as applicable, the next two bytes of in-line instructions. The M-Register is incremented by two for a TX instruction when the condition for that transfer is not met, resulting in a skip of two bytes. The M-Register is incremented by three for a Skip-On-Discrete (SD) instruction. The M-Register is exchanged with the $SPM_2$ register for transfer type instructions and exchanged with a data address register (D-Register) 414 to access operands from the core memory. The M-Register is also exchanged with the $SPM_2$ register at the start of an ST instruction which causes the contents of the A-Register to be stored in core memory.

The data address register (D-Register) 414 is a 12 bit shift register that usually contains an operand address and is used to select: (a) SPM register, (b) I/O channel, and (c) number of shifts, depending upon the type of instruction being executed. The D-Register has a serial input and serial output, with the eight least significant bits ($D_0$–$D_7$) having parallel outputs in addition.

A C-Register 416 is composed of six flip-flops which store the six most significant bits of an eight-bit instruction byte obtained from program memory. The flip flops $C_3$ through $K_{10}$ store the instruction bits designated $I_7$, $I_6$, $I_5$, $I_4$, $I_3$ and $I_2$, respectively as received from the core memory interface register (I). These instruction bits are held by the C-Register during the execution of an instruction to control the sequence of micro-operations executed during the performance of the instruction.

An element designed K-Register 418 is a group of miscellaneous flip-flops for various functions. The $K_0$, $K_1$, and $K_2$ flip flops are used primarily to control sequencing through the micro-operations. A $K_1$ flip-flop is also used to store the sign of the operand in the A-Register and the sign of a decremented number during a TX instruction. A $K_2$ flip-flop is also used to extend the A-Register during a shift left operation where the $K_2$ Register acts as the $A_{-1}$ stage of the A-Register. $K_3$, $K_4$, and $K_5$ flip-flops may be grouped together and designated a KA-Register and may be used to store the address of the index. The KA-Register is also used as an extension of the A-Register during a shift left operation with $K_3$ as an $A_{-2}$ stage, K4 as an $A_{-3}$ stage, and $K_5$ as an $A_{-4}$ stage of the A-Register. A $K_7$ flip-flop is used as a carry flip-flop in conjunction with the A-Register full adder. It is also used in a transfer of the D-Register contents to the M-Register as a shift left operation to multiply the D-Register word address to the level of the M-Register byte address. A $K_8$ flip-flop is used as a carry flip-flop in conjunction with the M-Register full adder. As previously described, the $K_{10}$ and $K_{11}$ flip-flops form the two least significant bits of the C-Register.

An element designated L-Register 420 is a group of miscellaneous flip-flops for performing control functions. The most significant is the $L_1$ flip-flop which controls turn-on and turn-off of the data processor.

Input/Output (I/O) channels 422 connect the A-Register with the various entities and extremities. The I/O channels are arranged in pairs so that as the output from the least significant bit ($A_0Q$) of the A-Register shifts information to an output channel a corresponding input channel may simultaneously shift information into the A-Register through the input to the most significant bit ($A_{15}D$).

A data path 424 provides two-way communication between the data processor and the core memory. This path carries the main core memory address stored in the M-Register and transfers operands to or from the main core memory data register (I).

Figure 7:
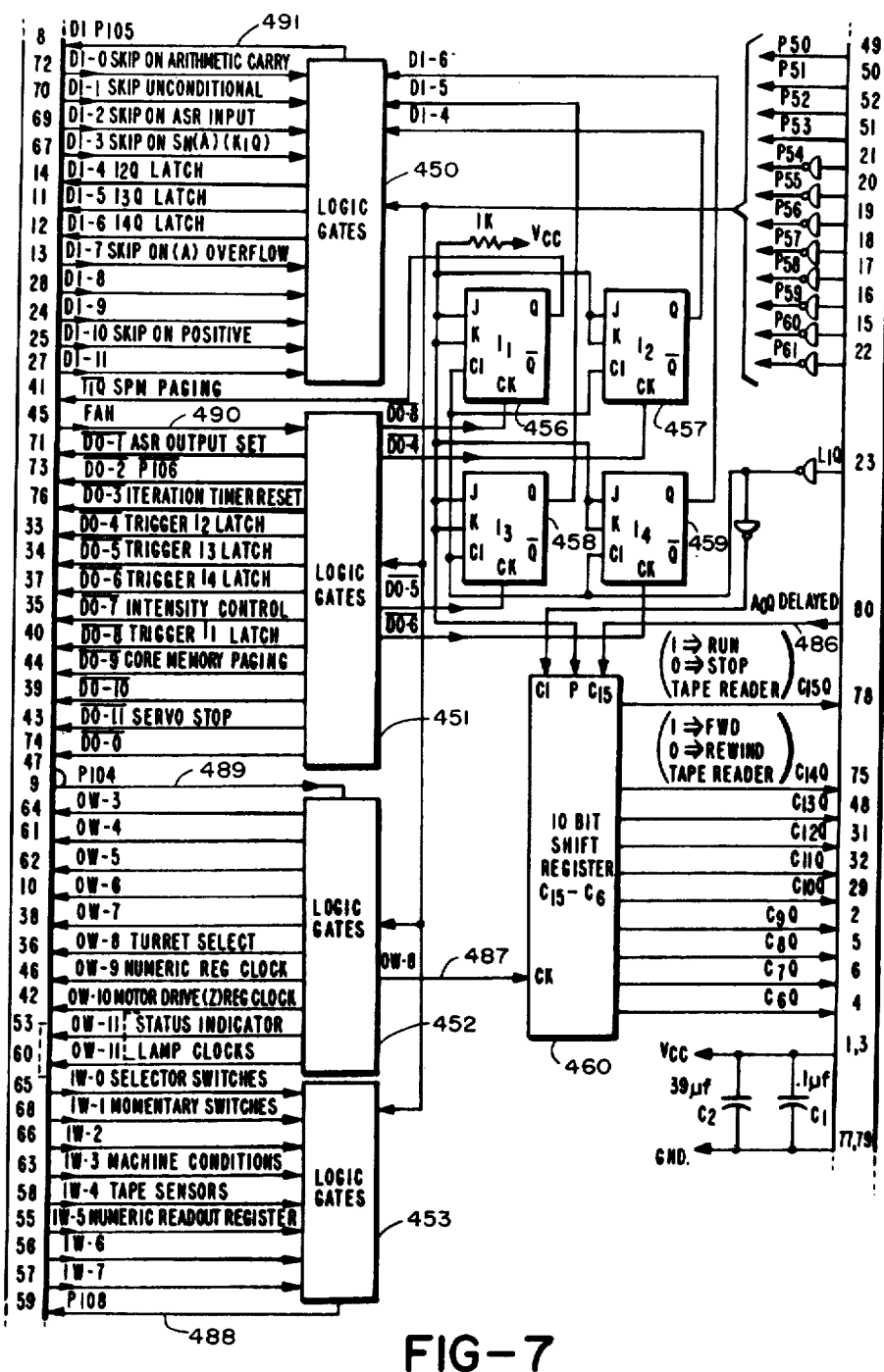
FIG. 7 is a schematic and block diagram representation of the IFA-board.

As shown in FIG. 7, the IFA-1 printed circuit board contains logic gates 450, 451, 452, and 453 providing input-output channels. The IFA-1 board accepts input and output type instruction micro-operation signals as well as address signals to encode or decode the various inputs and outputs. The input and output words are exchanged with the A-Register 408 in the data processor 212 (FIG. 6). The input words (IW) are multiplexed by logic gates 453 into signal P108 which is input to the A-Register. Information is output from the A-Register to the various entities by connecting the entities to $A_0Q$ and clocking a selected entity with a gated clock P104 as determined by logic gates 452. Discrete unit (DI) signals are multiplexed into signal P105 by logic gates 450. Discrete output (DO) signals are decoded and gated by logic gates 451. Micro-operation FAH provides the gating signal. The discrete input signals are accessed with Skip-On-Discrete decision instructions. Each discrete output signal provides a short negative going pulse when selected with a Discrete Output instruction. The I-Register flip-flops $I_1$–$I_4$ perform the function of latches toggled or set with the discrete outputs. The $I_1$ flip-flop is used to directly provide a Scratch Pad Memory paging function. Outputs from the flip-flops $I_1$, $I_3$, and $I_4$ become discrete inputs. A C-Register 460 is loaded with output word 8 and used for general system operations. The signals P50–P61 are decoded operand addresses from the data processor.

The interface assembly (IFA-1) is not an interface in the conventional sense but constitutes a group of operations associated with the data processor. The interface assembly performs the function of signal distribution between the data processor and various system extremities.

INSTRUCTION REPERTOIRE

The program instructions for the numerical control system 210 are encoded as 8-bit bytes, each byte being stored in a different program memory location of the core memory 230. The instructions may have multiple bytes, but most have a length of only 1 byte. Each instruction contains an operation code in the most significant portion, and, when required, an operand address in the least significant portion.

The Input/Output (EX) instruction is a one-byte indexable instruction, wherein the four most significant bits identify the operation code and the four least significant bits identify an I/O channel address. The contents of the A-Register 408 are output to the addressed channel while the contents of the addressed channel are simultaneously loaded into the A-Register 408. A shift enable signal is output to gate 16 clock pulses to the selected channel. The FAB micro-operation occurs in word time 1 for an Input/Output instruction and has a duration of 16 bit times. The contents of the A-Register 408 are shifted to a selected output channel while the contents of a selected input channel are simultaneously shifted into the A-Register 408.

The data processor 212 can generate discrete outputs (DO) with a Discrete Output instruction under program control. The DO assignments are:

| | |
|---|---|
| DO-0 | Spare. |
| DO-1 | Provide clock pulses to ASR-33 (teletypewriter). |
| DO-2 | Provides a clock to set the power turn-on interrupt, $L_1$. A DO-2 instruction (1100-0010) will be contained in program memory location $40_{16}$ to reset $L_1$ during power turn-on. |
| DO-3 | Iteration timer reset |
| DO-4 | Trigger to $I_2$ latch, the discrete input 4(DI-4) input. The $I_2$ flip-flop is automatically zero set during the power on sequence. |
| DO-5 | Trigger to $I_3$ latch, the discrete input-5(DI-5) input. The $I_3$ flip-flop is automatically zero set during the power turn-on sequence. |
| DO-6 | Trigger to $I_4$ latch, the discrete input-6 (DI-6) input. The $I_4$ flip-flop is automatically zero set during the power turn-on sequence. |
| DO-7 | Intensity control |
| DO-8 | Toggles the $I_1$ flip-flop causing scratch pad memory paging. |
| DO-9 | Main memory paging. |
| DO-10 | Not implemented. |
| DO-11 | Servo set. |

The Discrete Output (DC) instruction is a one-byte indexably instruction, wherein the three most significant bits define the operation code and the five least significant bits define an output channel address. An FAH discrete output signal, an inverted 3 microsecond pulse, is generated on the addressed output channel.

The data processor 212 can operate on a discrete input (DI) with a Skip-On-Discrete instruction under program control. The discrete inputs are various low frequency digital signals. The purpose of the discrete inputs is to define a status or condition. The DI assignments are:

| | |
|---|---|
| DI-0 | Not implemented. |
| DI-1 | Skip unconditional. |
| DI-2 | Skip on ASR-33 (teletypewriter). |
| DI-3 | Skip on the sign of (A). |
| DI-4 | Skip on $I_2Q$ latch (DO-4 trigger). |
| DI-5 | Skip on $I_3Q$ latch (DO-5 trigger). |
| DI-6 | skip on $I_4Q$ latch (DO-6 trigger). |
| DI-7 | Skip on logical overflow in A-Register |
| DI-8 | Used for troubleshooting. |
| DI-9 | Skip on arithmetic carry from A-Register. |
| DI-10 | Skip on positive. |
| DI-11 | Skip on servo ready. |

The Skip-On-Discrete (SK) instruction is a one-byte indexable instruction, wherein the three most significant bits identify the operation code and the five least significant bits identify a discrete input channel address. If a discrete exists on the addressed channel, three bytes (usually a transfer instruction) are skipped and the next instruction is obtained from the fourth byte following the Skip-On-Discrete instruction. If a discrete does not exist on the addressed channel, the next instruction (usually a three-byte transfer instruction) is obtained from the three bytes immediately following the Skip-On-Discrete instruction. The FAG micro-operation occurs in word time 1 for the Skip-On-Discrete instruction and has a duration of 12 bit times. If the selected discrete is true, the M-Register 412 is clocked and incremented by three. If the selected discrete is false, the M-Register 412 is not clocked and is therefore not incremented.

Although there has been described above a specific arrangement of an interactive control system in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention.

What is claimed is:

1. An interactive control system comprising an operator panel for communicating with an operator; said operator panel including panel input means for generating at least one input signal in response to an operator input action, display register means for storing at least one display signal from a data processor, and display output means for providing an operator display in response to the display signal stored in said display register means; said interactive control system further comprising a stored program data processor processing digital data including memory means for storing a plurality of instructions, execution means for deriving the significance of the received input signal and for generating at least one display signal in response to execution of at least one of the stored instructions, processor register means for providing temporary storage of signals involved in the execution of instructions, processor input means for periodically sampling and for receiving the input signal in response to execution of at least one instruction, and processor output means for outputting the display signal to said display register means in response to execution of at least one instruction.

2. A data processing system comprising:
an operator panel for providing communication between an operator and the data processing system, said operator panel including a plurality of input elements for providing input signals to a data processor in response to operator action and including a plurality of display elements for displaying information in response to display signals stored in an intermediate register means;

a said data processor for processing digital information including a. memory means for storing a plurality of instructions, b. execution means for interpreting the significance of received input signals and for executing the stored instructions in accordance with said interpretation, c. processor register means for storing digital signals involved in the execution of the instructions, d. processor input means for periodically sampling and for receiving the input signals in response to the execution of at least one of the stored instructions, e. output means for providing at least one intermediate output word to a display interface means in response to the execution of at least one stored instruction; and display interface means for generating display signals in response to the intermediate output word, said display interface means including intermediate register means for storing the intermediate output word.

3. The system as set forth in claim 2 above wherein said display output means includes a plurality of display elements and wherein said data processor includes means programmable for assembling a plurality of digital signals into an intermediate output word; said intermediate output word having an information content for causing the display elements to display a plurality of system conditions.

4. The system as set forth in claim 2 above wherein the intermediate output word includes an element select portion for identifying a particular display element and a display information portion for providing to be display information; wherein a plurality of said display elements are refreshed by the information to be displayed portion of the intermediate output word stored in the intermediate register means in response to identification thereof by the element select portion of said stored intermediate output word, and wherein said data processor includes means programmable for generating a sequence of intermediate output words to sequentially excite the plurality of display elements at a desired refresh rate.

5. The system as set forth in claim 2 above further comprising input signal processing means for processing the input signals from the input elements and providing processed input signals to the processor input means, said input signal processing means including storage means for storing the input signals in response to an enable signal and enable means for providing an enable signal to the storage means in response to a selected status of the input elements.

6. A data processing system comprising:

an operator panel for generating input signals to a data processor means in response to operator action;

stored program data processor means for processing digital information including a. memory means for storing a program of a plurality of instructions, b. execution means for interpreting the significance of received input signals and for executing the stored instructions in accordance with said interpretation, c. data processor register means being shared for temporary storage of information involved in the execution of a plurality of the stored d. processor input means for periodically sampling and for receiving said input signals in response to the execution of at least one stored instruction, and e. output means for generating display signals in response to the execution of at least one stored instruction;

display register means for storing the display signals generated by the data processor means; and display means for providing an operator display in response to the display signals stored in said display register means.

7. The system as set forth in claim 6 above wherein said display means includes a plurality of display elements, each of said display elements being responsive to a different display signal of a plurality of display signals stored in said display register means for providing the operator display.

8. The system as set forth in claim 6 above wherein said panel input means includes at least one selector switch for generating selector switch input signals and a plurality of momentary switches for generating momentary switch input signals, wherein said data processing system further includes encoder means for generating at least one intermediate input digital word in response to the selector switch input signals and the momentary switch input signals, and wherein said data processor means further includes processor input means for receiving the intermediate input digital word in response to the execution of at least one stored instruction.

9. The system as set forth in claim 6 above wherein the display signals are refresh signals and wherein said display means includes refreshable display elements for providing a substantially continuous display to an operator in response to the display signals stored in said display register means.

10. A data processing system comprising a stored program data processor for processing information in response to a stored program; said data processor including a. memory means for storing a program, said program including a plurality of stored instructions, b. execution means for executing stored instructions to generate display signals in response to input signals received from a processor input means, said execution means including means for deriving the significance of said input signals, c. processor register means for storing information in response to execution of stored instructions, d. processor input means for periodically sampling and for receiving the input signals in response to at least one stored instruction, and e. processor output means for outputting at least one display signal in response to execution of at least one stored instruction;

said data processing system further comprising panel means for communicating with a system operator; said panel means including a. a plurality of switch devices for generating the input signals in response to operator action, b. an interface register for storing the display signal that is output from the data processor, and c. a plurality of display devices for generating an operator display in response to the display signal stored in the interface register.

11. A display system comprising:

display means for displaying information to an operator including a plurality of refreshable display elements for display of selected characters in response to select signals;

select means connected to said display means for providing the select signals to select at least one of said plurality of display elements in response to a refresh command;

interface register means for storing the refresh command from a stored program data processor output means and supplying said refresh command to said select means; and stored program data processor means for processing digital information including a. memory means for storing a program including a plurality of instructions, b. execution means for executing the stored instructions, c. processor register means for storing signals involved in the execution of each of a plurality of instructions, d. output means for generating the refresh command and for outputting said refresh command to said interface register means in response to the execution of at least one instruction.

12. The system as set forth in claim 11 above, wherein said data processor means includes means responsive to a plurality of the instructions for selecting a display word, means for accessing the selected display word from a plurality of display words stored in said memory means, and means for outputting the selected display word and a select word to said interface register means; said interface register means including means responsive to the select word for selecting a display element and means responsive to the selected display word for displaying a desired character with the selected display element.

13. A display system comprising:

processor memory means for storing instructions and for storing digital data, said digital data including a plurality of display words wherein each display word includes refresh information for a different display element;

means for accessing a display word from said processor memory means;

means for generating a select code for selecting a particular display element;

execution means for executing stored instructions to generate at least one intermediate display word in response to the stored display word that is accessed from said processor memory means and the select code from said select code generating means;

processor register means for storing information in response to execution of stored instructions;

output means for outputting the intermediate display word from said execution means in response to at least one of the stored instructions;

interface memory means for storing the intermediate display word from said output means; and a plurality of refreshable display elements for providing an operator display in response to the intermediate display word stored in said interface memory means.

14. The system as set forth in claim 13 above further comprising means for changing at least one of the display words stored in said processor memory means in response to the stored instructions.

15. The system as set forth in claim 13 above further comprising means for converting a display word stored in said processor memory means to a code in response to the stored instructions; said code being related to a selected arrangement of segments of a display element.

* * * * *

UNITED STATES PATENT AND TRADEMARK OFFICE
CERTIFICATE OF CORRECTION

PATENT NO. : 4,038,640
DATED : July 26, 1977
INVENTOR(S) : Barry T. Lee, Ralph V. Cole, Irving Hirsch
Gilbert P. Hyatt, Gunther W. Wimmer It is certified that error appears in the above-identified patent and that said Letters Patent are hereby corrected as shown below:

| | |
|---|---|
| Column 20, line 50 | after "processor" insert —for— |
| Column 21, line 4 | delete "a" |
| Column 21, lines 37 and 38 | delete "to be display information" and insert therefor —information to be displayed— |
| Column 21, lines 39 and 40 | delete "information to be displayed" and insert therefor —display information— |
| Column 22, line 3 | after "stored" insert —instructions— |
| Column 22, line 36 | delete "substantially" |

Signed and Sealed this

Fifth Day of June 1979

[SEAL]

Attest:

RUTH C. MASON
Attesting Officer

DONALD W. BANNER
Commissioner of Patents and Trademarks